(12) United States Patent
McManis

(10) Patent No.: US 7,734,603 B1
(45) Date of Patent: Jun. 8, 2010

(54) CONTENT ADDRESSABLE STORAGE ARRAY ELEMENT

(75) Inventor: Charles McManis, Sunyvale, CA (US)

(73) Assignee: NetApp, Inc., Sunnyvale, CA (US)

( * ) Notice: Subject to any disclaimer, the term of this patent is extended or adjusted under 35 U.S.C. 154(b) by 275 days.

(21) Appl. No.: 11/340,308

(22) Filed: Jan. 26, 2006

(51) Int. Cl.
  G06F 7/00 (2006.01)
  G06F 17/00 (2006.01)
(52) U.S. Cl. .................. 707/696; 707/698
(58) Field of Classification Search ............ 707/205
  See application file for complete search history.

(56) References Cited

U.S. PATENT DOCUMENTS

| | | | |
|---|---|---|---|
| 4,156,907 A | 5/1979 | Rawlings et al. | |
| 4,399,503 A | 8/1983 | Hawley | |
| 4,598,357 A | 7/1986 | Swenson et al. | |
| 4,688,221 A | 8/1987 | Nakamura et al. | |
| 4,698,808 A | 10/1987 | Ishii | |
| 4,761,785 A | 8/1988 | Clark et al. | |
| 4,775,932 A * | 10/1988 | Oxley et al. ............ | 707/206 |
| 4,805,090 A | 2/1989 | Coogan | |
| 4,837,675 A | 6/1989 | Bean et al. | |
| 4,864,497 A | 9/1989 | Lowry et al. | |
| 4,896,259 A | 1/1990 | Jacobs et al. | |
| 4,899,342 A | 2/1990 | Potter et al. | |
| 4,989,206 A | 1/1991 | Dunphy, Jr. et al. | |
| 5,124,987 A | 6/1992 | Milligan et al. | |
| RE34,100 E | 10/1992 | Hartness | |
| 5,155,835 A | 10/1992 | Belsan | |
| 5,426,747 A | 6/1995 | Weinreb et al. | |
| 5,568,629 A | 10/1996 | Gentry et al. | |
| 5,581,724 A | 12/1996 | Belsan et al. | |

(Continued)

FOREIGN PATENT DOCUMENTS

GB  2341715 A  3/2000

(Continued)

OTHER PUBLICATIONS

PCT Notification of Transmittal of the International Search Report and the Written Opinion of the International Searching Authority, or the Declaration, International Application No. PCT/US2007/001909, International Filing Date: Jan. 25, 2007; Date of Mailing Jun. 6, 2007, 12 pages.

(Continued)

Primary Examiner—James Trujillo
Assistant Examiner—Marc Somers
(74) Attorney, Agent, or Firm—Cesari and McKenna LLP

(57) ABSTRACT

A content addressable storage array element (CASAE) of a storage system is configured to eliminate duplicate data stored on its storage resources. The CASAE independently determines whether data associated with a write operation has already been written to a location on its storage resources. To that end, the CASAE performs a content addressable storage computation on each data block written to those resources in order to prevent storage of two or more blocks with the same data. If data of a block has been previously stored on the resources, the CASAE cooperates with a file system executing on the system to provide a reference (block pointer) to the same data block rather than duplicate the stored data. Otherwise, the CASAE stores the data block at a new location on the resources and provides a block pointer to that location.

23 Claims, 10 Drawing Sheets

U.S. PATENT DOCUMENTS

| | | | | |
|---|---|---|---|---|
| 5,721,907 | A | * | 2/1998 | Pyne .......................... 707/10 |
| 5,732,265 | A | | 3/1998 | Dewitt et al. |
| 5,819,292 | A | | 10/1998 | Hitz et al. |
| 5,990,810 | A | * | 11/1999 | Williams ..................... 341/51 |
| 6,073,209 | A | * | 6/2000 | Bergsten ..................... 711/114 |
| 6,421,767 | B1 | * | 7/2002 | Milillo et al. ............... 711/162 |
| 6,516,380 | B2 | | 2/2003 | Kenchammana-Hoskote et al. |
| 6,636,879 | B1 | | 10/2003 | Doucette et al. |
| 6,643,654 | B1 | | 11/2003 | Patel et al. |
| 6,862,674 | B2 | * | 3/2005 | Dice et al. .................. 711/170 |
| 7,194,597 | B2 | | 3/2007 | Willis et al. |
| 2002/0152231 | A1 | * | 10/2002 | Silva-Craig et al. ......... 707/204 |
| 2004/0030668 | A1 | | 2/2004 | Pawlowski |
| 2004/0220975 | A1 | * | 11/2004 | Carpentier et al. .......... 707/200 |
| 2005/0071436 | A1 | * | 3/2005 | Hsu et al. ................... 709/212 |
| 2005/0091234 | A1 | | 4/2005 | Hsu et al. |
| 2005/0125384 | A1 | | 6/2005 | Gilfix et al. |
| 2005/0246311 | A1 | | 11/2005 | Whelan et al. |
| 2005/0246382 | A1 | | 11/2005 | Edwards |
| 2005/0246401 | A1 | | 11/2005 | Edwards et al. |
| 2005/0283489 | A1 | * | 12/2005 | Shiozawa et al. ........... 707/100 |
| 2007/0088702 | A1 | | 4/2007 | Fridella et al. |

FOREIGN PATENT DOCUMENTS

| | | |
|---|---|---|
| WO | WO 89/10594 | 11/1989 |
| WO | WO 96/25801 A1 | 8/1996 |
| WO | WO 2005/011803 A2 | 11/2005 |

OTHER PUBLICATIONS

Administration Guide found at http://www.openafs.org/pages/doc/AdminGuide/auagd010.htm visited on Mar. 2, 2005.
Basilico, et al., *Error Correction System Using "Shadow Memory,"* IBM Technical Disclosure Bulletin, May 1984, pp. 5792-5793.
Bitton, Dina, *Disk Shadowing*, Proceedings of the 14$^{th}$ VLDB Conference, LA, CA (1988).
Blasgen, M.W. et al., *System R:An architectural Overview*,Reprinted from IBM Systems Journal vol. 20, No. 1, 1981 © 1981, 1999.
Borenstein, Nathaniel S., *CMU's Andrew project a retrospective*, Communications of ACM, (39)12, Dec. 1996.
Brown, Mark R. et al., *The Alpine file system*, ACM Transactions on Computing Systems, 3(4):261-293, Nov. 1985.
Chen, Peter M., et al., *An Evaluation of Redundant Arrays of Disks Using an Amdahl 5890*Performance Evaluation, pp. 74-85, 1990.
Chutani, Sailesh, et al., *The Episode file system*, In Proceedings of the USENIX Winter 1992.
Clark, B.E., et al., *Application System /400 Performance Characteristics*, IBM Systems Journal, 28(3): 407-423, 1989.
Data Sheet for the Check Point Software Technologies product Flood-Gate-1 (1997).
Dibble, Peter C., et al., *Beyond Striping: The Bridge Multiprocessor File System*, Computer Science Department, University of Rochester, Aug. 11, 1989.
Douglis, Fred, et al., *A comparison of two distributed systems: Amoeba and Sprite*—Computing Systems, 4(4), Fall 1991, pp. 353-385.
Gait, Jason, *Phoenix: A Safe In-Memory File System*. Communications of the ACM, 33(1):81-86, Jan. 1990.
Hartman, John H. et al., *Performance Measurements of a Multiprocessor Sprite Kernel*, Proceedings of the USENIX Conference, 1990.
Hitz, Dave et al., *File System Design for an NFS File Server Appliance*, Technical Report 3002, Rev. C395, presented Jan. 19, 1994.
Hitz, David, et al. *System and Method for Enabling a Storage System to Support Multiple Volume Formats Simultaneously*, U.S. Appl. No. 60/652,626, filed Feb. 14, 2005.
Howard, John H, et al. *Scale and Performance in a Distributed File System*, Carnegie Mellon University, CMU-ITC-87-068, Aug. 5, 1987.
Howard, John, H. et al., *Scale and performance in a distributed file system*, ACM Trans. Computer. System., 6(1), Feb. 1988 pp. 51-81.
Isomaki, Markus, *Differentiated Service for the Internet*, Department of Technical Physics and Mathematics, May 9, 1998.
Kazar, Michael L., et al., *Decorum File System Architectural Overview*, USENIX Summer Conference, Anaheim, California, 1990.
Lorie, Raymond, A, *Physical integrity in a large segmented database*, ACM Trans. Database Systems, (2)1: 91-104, Mar. 1977.
Lorie, RA, *Shadow Page Mechanism*, IBM Technical Disclosure Bulletin, Jun. 1986, pp. 340-342.
McKusick, Marshall Kirk, et al., *A Fast File System for UNIX*, Computer Science Division, Department of Electrical Engineering and Computer Sciences, Univ. of CA, Berkley, Feb. 18, 1994.
Miller, Ethan L., et al., *RAMA:A File System for Massively Parallel Computers*, 12$^{th}$ IEEE Symposium on Mass Storage Systems, Monterey CA, Apr. 1993, pp. 163-168.
Moons, Herman et al., *Location-Independent Object Invocation in Open Distributed Systems*, Autumn 1991 EurOpen Technical Conference and Exhibition, pp. 287-300 (Sep. 16-20, 1991).
Morris, James H., et al, *Andrew: A Distributed Personal Computing Environment*, Comm. of the ACM, vol. 29, Mar. 1986, pp. 184-201.
Mullender, Sape J., et al., *A distributed file service based on optimistic concurrency control*, ACM Symposium on Operating System Principles (Orcas Island, Washington). Published as Operating Systems Review, 19(5):51-62, Dec. 1985.
Muller, Keith, et al., *A High Performance Multi-Structured File System Design*, In Proceedings of the 13th ACM Symposium on Operating Systems Principles, Oct. 1991, pp. 56-67.
Ousterhout, John K. et al., *The Sprite Network Operating System*, Computer Science Division, Department of Electrical Engineering and Computer Sciences, Univ. of CA, Berkley, Nov. 19, 1987.
Ousterhout, John et al., *Beating the I/O Bottleneck: A Case for Log-Structured File Systems*, Technical Report, Computer Science Division, Electrical Engineering and Computer Sciences, University of California at Berkeley, Oct. 30, 1988.
Ousterhout, John, *Why Aren't Operating Systems Getting Faster as Fast as Hardware?*, Digital WRL Technical Note TN-11, Oct. 1989.
Ousterhout, John, *A Brief Retrospective On The Sprite Network Operating System*, found at http://www.cs.berkeley.edu/projects/sprite/retrospective.html,visited on Mar. 11, 2005.
Patterson, D., et al., *A Case for Redundant Arrays of Inexpensive Disks (RAID)*, Technical Report, CSD-87-391, Computer Science Division, Electrical Engineering and Computer Sciences, University of California at Berkeley (1987).
Patterson, D., et al., *A Case for Redundant Arrays of Inexpensive Disks (RAID)*, SIGMOD International Conference on Management of Data, Chicago, IL, USA, Jun. 1-3, 1988, SIGMOD Record (17)3:109-16 (Sep. 1988).
Peterson, Zachary Nathaniel Joseph, *Data Placement for Copy-on-Write Using Virtual Contiguity*, University of CA, Santa Cruz, Master of Science in Computer Science Thesis, Sep. 2002.
Quinlan, Sean, *A Cached WORM File System*, Software-Practice and Experience, 21(12):1289-1299 (1991).
Redundant Array of Independent Disks, from Wikipedia, the free encyclopedia, found at http://en.wikipedia.org/wiki/RAID, visited on Mar. 9, 2005.
Rosenberg, J., et al., *Stability in a Persistent Store Based on a Large Virtual Memory*, In Security and Persistence, Rosenber, J. & Keedy, J.L. (ed), Springer-Verlag (1990) pp. 229-245.
Rosenblum, Mendel, et al., *The LFS Storage Manager*, Computer Science Division, Electrical Engin. And Computer Sciences, Univ. of CA, presented at Summer '90 USENIX Technical Conference, Anaheim, CA Jun. 1990.
Rosenblum, Mendel, et al., *The Design and Implementation of a Log-Structured File System* Jul. 24, 1991 pp. 1-15.
Rosenblum, Mendel, et al., *The Design and Implementation of a Log-Structured File System*, , In Proceedings of ACM Transactions on Computer Systems, (10)1:26-52, Feb. 1992.
Sandberg, Russel et al., *Design and implementation of the Sun Network Filesystem*. In Proc. Summer 1985 USENIX Conf., pp. 119-130, Portland OR (USA), Jun. 1985.
Santry, Douglas S., et al., *Deciding When to Forget in the Elephant File System*, Operating Systems Review, 34(5), (Dec. 1999) pp. 110-123.

Satyanarayanan, M., et al., *The ITC Distributed File System: Principles and Design*, In Proceedings of the 10th ACM Symposium on Operating Systems Principles, (19)5:56-67, Dec. 1985.

Satyanarayanan, M.. *A survey of distributed file-systems*. Annual Review of Computing Science, 4(73-104), 1989.

Satyanarayanan, M., et al, *Coda: A highly available file system for a distributed workstation environment*. IEEE Transactions on Computers, 39(4):447-459, 1990.

Satyanarayanan, Mahadev, *Scalable, Secure, and Highly Available Distributed File Access*, Computer May 1990: 9-21.

Sidebotham, Bob, *Volumes: The Andrew File System Data Structuring Primitive*, EEUG Conference Proceedings, Manchester, UK, Autumn 1986.

User Guide found at http://www.openafs.org/pages/doc/UserGuide/auusg004.htm, visited on Mar. 2, 2005.

Welch, Brent B., et al., *Pseudo Devices: User-Level Extensions to the Sprite File System*, Computer Science Division, Department of Electrical Engineering and Computer Sciences, Univ. of CA, Berkley, Apr. 1988.

Welch, Brent B., et al., *Pseudo-File-Systems*, Computer Science Division, Department of Electrical Engineering and Computer Sciences, Univ. of CA, Berkley, Oct. 1989.

Wittle, Mark, et al, *LADDIS: The next generation in NFS file server benchmarking*, USENIX Association Conference Proceedings, Apr. 1993.

* cited by examiner

{}# CONTENT ADDRESSABLE STORAGE ARRAY ELEMENT

CROSS-REFERENCE TO RELATED APPLICATION

The present invention is related to the following commonly assigned U.S. patent application Ser. No. 11/339,888 titled, Content Addressable Storage System, filed herewith.

FIELD OF THE INVENTION

The present invention relates generally to data storage compression and, more specifically, to a content addressable storage array element of a storage system that is configured to eliminate duplicate data stored on its storage resources.

BACKGROUND OF THE INVENTION

A storage system typically comprises one or more storage devices into which information may be entered, and from which information may be obtained, as desired. The storage system includes a storage operating system that functionally organizes the system by, inter alia, invoking storage operations in support of a storage service implemented by the system. The storage system may be implemented in accordance with a variety of storage architectures including, but not limited to, a network-attached storage environment, a storage area network and a disk assembly directly attached to a client or host computer. The storage devices are typically disk drives organized as a disk array, wherein the term "disk" commonly describes a self-contained rotating magnetic media storage device. The term disk in this context is synonymous with hard disk drive (HDD) or direct access storage device (DASD).

Storage of information on the disk array is preferably implemented as one or more storage "volumes" of physical disks, defining an overall logical arrangement of disk space. The disks within a volume are typically organized as one or more groups, wherein each group may be operated as a Redundant Array of Independent (or Inexpensive) Disks (RAID). Most RAID implementations enhance the reliability/integrity of data storage through the redundant writing of data "stripes" across a given number of physical disks in the RAID group, and the appropriate storing of redundant information (parity) with respect to the striped data. The physical disks of each RAID group may include disks configured to store striped data (i.e., data disks) and disks configured to store parity for the data (i.e., parity disks). The parity may thereafter be retrieved to enable recovery of data lost when a disk fails. The term "RAID" and its various implementations are well-known and disclosed in *A Case for Redundant Arrays of Inexpensive Disks (RAID)*, by D. A. Patterson, G. A. Gibson and R. H. Katz, Proceedings of the International Conference on Management of Data (SIGMOD), June 1988.

The storage operating system of the storage system may implement a high-level module, such as a file system, to logically organize the information stored on the disks as a hierarchical structure of named data containers, such as directories, files and blocks. For example, each "on-disk" file may be implemented as set of data structures, i.e., disk blocks, configured to store information, such as the actual data for the file. These data blocks are organized within a volume block number (vbn) space that is maintained by the file system. The file system organizes the data blocks within the vbn space as a "logical volume"; each logical volume may be, although is not necessarily, associated with its own file system. The file system typically consists of a contiguous range of vbns from zero to n, for a file system of size n−1 blocks.

A known type of file system is a write-anywhere file system that does not overwrite data on disks. If a data block is retrieved (read) from disk into a memory of the storage system and "dirtied" (i.e., updated or modified) with new data, the data block is thereafter stored (written) to a new location on disk to optimize write performance. A write-anywhere file system may initially assume an optimal layout such that the data is substantially contiguously arranged on disks. The optimal disk layout results in efficient access operations, particularly for sequential read operations, directed to the disks. An example of a write-anywhere file system that is configured to operate on a storage system is the Write Anywhere File Layout (WAFL™) file system available from Network Appliance, Inc., Sunnyvale, Calif.

The storage operating system may further implement a storage module, such as a RAID system, that manages the storage and retrieval of the information to and from the disks in accordance with input/output (I/O) operations. The RAID system is also responsible for parity operations performed on the RAID groups in the storage system. The RAID system typically organizes the RAID groups into one large "physical" disk (i.e., a physical volume), such that the disk blocks are concatenated across all disks of all RAID groups. The logical volume maintained by the file system is then "disposed over" (spread over) the physical volume maintained by the RAID system.

The storage system may be configured to operate according to a client/server model of information delivery to thereby allow many clients to access the directories, files and blocks stored on the system. In this model, the client may comprise an application, such as a database application, executing on a computer that "connects" to the storage system over a computer network, such as a point-to-point link, shared local area network, wide area network or virtual private network implemented over a public network, such as the Internet. Each client may request the services of the file system by issuing file system protocol messages (in the form of packets) to the storage system over the network. By supporting a plurality of file system protocols, such as the conventional Common Internet File System (CIFS) and the Network File System (NFS) protocols, the utility of the storage system is enhanced.

When accessing a block of a file in response to servicing a client request, the file system specifies a vbn that is translated by the RAID system into a physical block number (pbn) location on a particular disk (disk, pbn) within a RAID group of the physical volume. Each block in the vbn space and in the pbn space is typically fixed, e.g., 4 k bytes (kB), in size; accordingly, there is typically a one-to-one mapping between the information stored on the disks in the pbn space and the information organized by the file system in the vbn space. The (disk, pbn) location specified by the RAID system may be further translated by a disk driver system of the storage operating system into a plurality of sectors on the specified disk.

The requested block is then retrieved from disk and stored in a buffer cache of the memory as part of a buffer tree of the file. The buffer tree is an internal representation of blocks for a file stored in the buffer cache and maintained by the file system. Broadly stated, the buffer tree has an inode at the root (top-level) of the file. An inode is a data structure used to store information, such as metadata, about a file, whereas the data blocks are structures used to store the actual data for the file. The information contained in an inode may include, e.g., references to locations on disk of the data blocks for the file. The references to the locations of the file data are provided by block pointers, which may further reference indirect blocks that, in turn, reference the data blocks, depending upon the quantity of data in the file.

The RAID system maintains information about the geometry of the underlying physical disks (e.g., the number of blocks in each disk) in data structures, such as raid labels, stored on the disks. The RAID system provides the disk geometry information to the file system for use when creating and maintaining the vbn-to-disk, pbn mappings used to perform write allocation operations and to translate vbns to disk locations for read operations. Block allocation data structures, such as an active map, a snapmap, a space map and a summary map, are data structures that describe block usage within the file system, such as the write-anywhere file system. These mapping data structures are independent of the geometry and are used by a write allocator of the file system as existing infrastructure for the logical volume.

Data storage is a central part of many industries that operate in archival and compliance application environments, such as banks, government facilities/contractors and securities brokerages. In many of these environments, it is necessary to store selected data, e.g., e-mails, financial documents and transaction records, in an immutable and unalterable manner, possibly for long periods of time. Typically, data backup operations are performed to ensure the protection and restoration of such data in the event of failure. However, backup operations often result in the duplication of data on backup storage resources, such as disks, causing inefficient consumption of storage space on those resources. It is thus desirable to eliminate duplicate data on the storage resources and ensure the storage of only single instances of data to thereby achieve storage compression.

One known approach to providing data storage compression involves a content addressable storage system that utilizes a hash to determine whether or not data to be written previously exists on backup storage resources. The process of computing the hash in the content addressable storage system typically takes place at the file level (as opposed to the logical unit or lun level) and is relatively slow because of the substantial computation needed to determine whether or not the data has already been stored. Consequently, write operations are typically slow processes; this is the bane of content addressable storage systems in the industry.

Another known approach is the Carnegie Mellon University (CMU) Network Attached Secure Disk (NASD) system developed by the CMU Parallel Development Lab. The NASD involves "smart" disks attached to a network as a way of replacing direct attached disks. However, as in the case of a general purpose system, this approach suffers from performance that is not sufficient for primary storage and from the use of public networks that are not sufficiently reliable to provide predictable performance.

SUMMARY OF THE INVENTION

The present invention is directed to a content addressable storage array element (CASAE) of a storage system configured to prevent the storage of duplicate data on its storage resources. According to the invention, the CASAE independently determines whether data associated with a write operation has already been written to a location on its storage resources. To that end, the CASAE performs a content addressable storage computation on each data block written to those resources in order to prevent storage of two or more blocks with the same data. If data of a block has been previously stored on the resources, the CASAE cooperates with a file system executing on the system to provide a reference (block pointer) to the same data block rather than duplicate the stored data. Otherwise, the CASAE stores the data block at a new location on the resources and provides a block pointer to that location.

In the illustrative embodiment, the CASAE is a block-oriented element comprising, inter alia, a controller adapted to perform the content addressable storage computation, a plurality of disk ports and a plurality of network ports adapted to couple to the storage system via a switching fabric. The disk ports, in turn, are coupled to the storage resources (e.g., disks) of the CASAE to thereby form a "storage brick". The disks of the CASAE storage brick are exported as logical unit (lun) and organized as a single RAID level implementation group configured to increase the reliability of the disks.

In response to a client request to write data to the lun, the file system employs a special block number, e.g., block zero, to instruct the CASAE to perform the content addressable storage computation on each data block to determine whether that data has already been written to a location on the lun. The storage computation illustratively involves a hashing function because of the substantial domain space involved with data storage on the disks. Specifically, the CASAE computes a hash key based on the content of the data block and then determines whether the key has been generated for a previously stored data block. If so, a comparison of the data block contents having similar keys is performed and, if the contents match, a reference count on the previously stored data block is incremented. The block number (location) of the previously stored data block is then returned to the file system. On the other hand, if the hash key has not been previously generated or if the data contents do not match, the data is written to a next available block location on the lun and its location returned to the file system.

BRIEF DESCRIPTION OF THE DRAWINGS

The above and further advantages of the invention may be better understood by referring to the following description in conjunction with the accompanying drawings in which like reference numerals indicate identical or functionally similar elements.

DETAILED DESCRIPTION OF AN ILLUSTRATIVE EMBODIMENT

The present invention is directed to a content addressable storage array element (CASAE) of a storage system, such as content addressable storage system (CASS), configured to eliminate duplicate data stored on its storage resources. According to the invention, the CASAE independently determines whether data associated with a write operation has already been written to a location on its storage resources. To that end, the CASAE performs a content addressable storage computation on each data block written to those resources in order to prevent storage of two or more blocks with the same data. If data of a block has been previously stored on the resources, the CASAE cooperates with a file system executing on the system to provide a reference (block pointer) to the same data block rather than duplicate the stored data. Otherwise, the CASAE stores the data block at a new location on the resources and provides a block pointer to that location.

Figure 1:
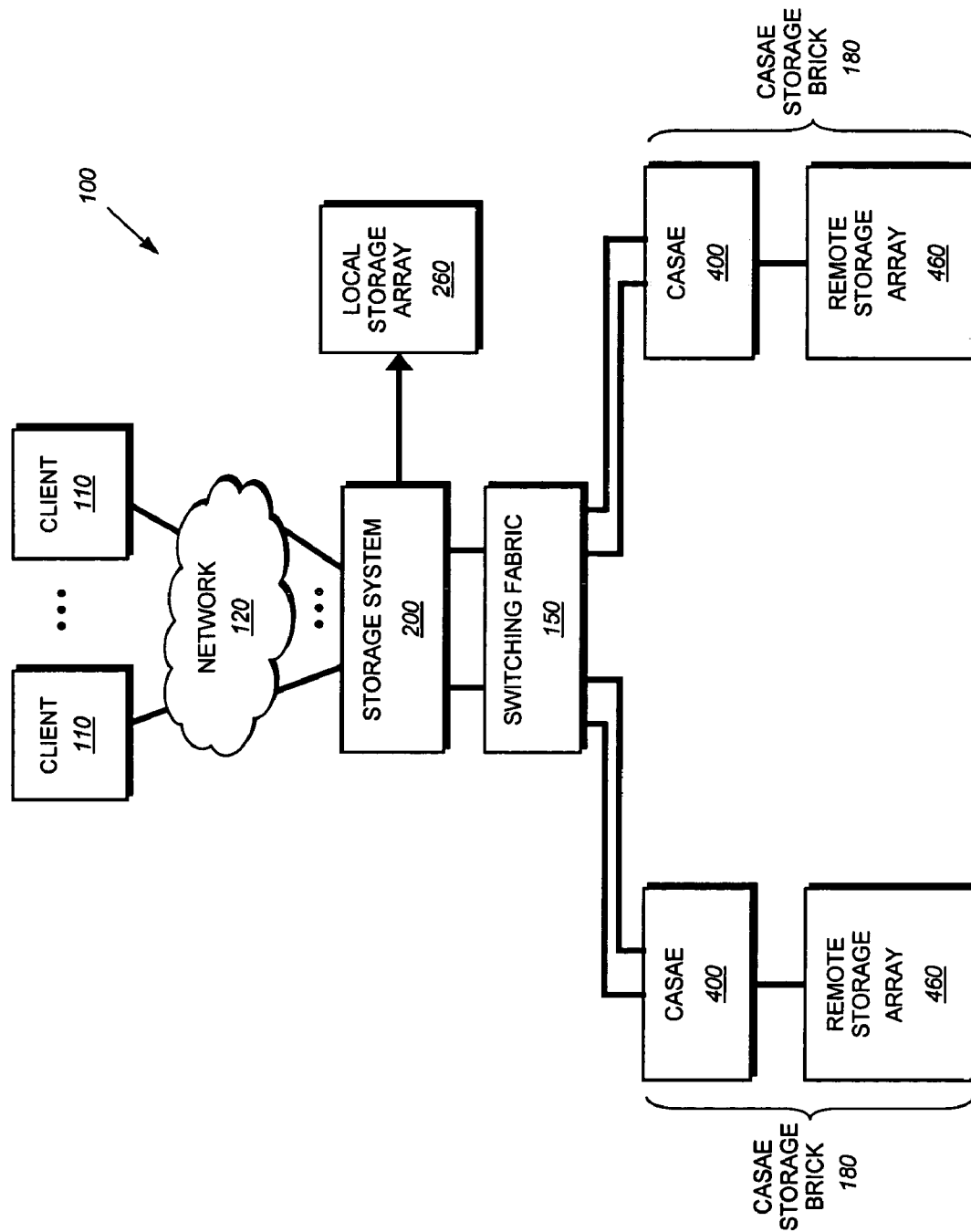
FIG. 1 is a schematic block diagram of a content addressable storage system (CASS) that may be advantageously used with the present invention.

FIG. 1 is a schematic block diagram of a content addressable storage system (CASS) that may be advantageously used with the present invention. The CASS 100 comprises a storage system 200 coupled to one or more CASAEs 400 via a switching fabric 150. The switching fabric 150, e.g., an Ethernet switch, is illustratively used for connectivity between the storage system 200 and each CASAE 400 to provide a low cost, hot-pluggable network infrastructure of the CASS 100. Clients 110 are connected to the storage system 200 over a computer network 120, which may comprise a point-to-point connection or a shared medium, such as a local area network. Illustratively, the computer network 120 may be embodied as an Ethernet network or a Fibre Channel (FC) network. Each client 110 may communicate with the storage system over network 120 by exchanging discrete frames or packets of data according to pre-defined protocols, such as the Transmission Control Protocol/Internet Protocol (TCP/IP).

The client 110 may be a general-purpose computer configured to execute applications and interact with the storage system 200 in accordance with a client/server model of information delivery. That is, the client may request the services of the storage system, and the system may return the results of the services requested by the client, by exchanging packets over the network 120. The clients may issue packets including file-based access protocols, such as the Common Internet File System (CIFS) protocol or Network File System (NFS) protocol, over TCP/IP when accessing information, such as data, in the form of files and directories. Alternatively, the client may issue packets including block-based access protocols, such as the Small Computer Systems Interface (SCSI) protocol encapsulated over TCP (iSCSI) and SCSI encapsulated over Fibre Channel (FCP), when accessing information in the form of blocks.

As described herein, the storage system 200 is coupled to storage resources, e.g., disks, of a local storage array 260 configured to store a high level meta-directory that describes data containers, e.g., directories, files and logical units (luns), served by the CASS 100. In addition, each CASAE 400 is coupled to disks of a remote storage array 460 configured to store user data (data blocks) of the data containers served by the CASS 100. Notably, the CASAE interacts with its associated remote storage array to form a CASAE "storage brick" 180. As used herein, a storage brick denotes a relatively non-intelligent set of disks that have a relatively small amount of storage capacity. The storage capacity of the remote storage array 460 of each CASAE storage brick 180 cooperates with the storage capacity of the local storage array 260 of storage system 200 to provide an extended storage space of the CASS 100.

Additional CASAE storage bricks 180 may be inserted into the CASS 100 to allow striping of write operations across the bricks. These multiple storage bricks 180 operate in parallel to allow aggregation of resources among the bricks, thereby enabling fast and efficient performance of content addressable storage computations associated with the write operations. Thus, the organization of one or more CASAE storage bricks 180 may enable to CASS 100 to form a grid architecture. Moreover, the addition of CASAE storage bricks 180 enables scaling (increasing) of storage and servicing of the disks without compromising access to data. Each time a remote storage array 460 is added to the CASS, another compute element of the CASAE brick 180 is illustratively added that is capable of performing storage computations over the (relatively small) array. This enables a scalable system without degradation because of the balancing of computation among the bricks. That is, a CASAE 400 illustratively serves a relatively small number (e.g., 8) of disks, instead of a typically larger number (e.g., 16, 32 or 64) in local storage array 260 served by the storage system 200. If the storage computations were performed by the storage system 200 for content addressable storage implemented on the disks of the local storage array 260, performance would be limited (i.e., slowed) because of the larger storage capacity and corresponding larger domain space that must be searched to determine whether or not a copy of the data exists.

In order to provide increased reliability and availability for the CASS, the storage bricks 180 may be organized as a group and operated as a Redundant Array of Independent (or Inexpensive) Disks (RAID). Most RAID implementations, such as a RAID-4 level implementation, enhance the reliability/integrity of data storage through the redundant writing of data "stripes" across a given number of physical disks in the RAID group, and the appropriate storing of parity information with respect to the striped data. Here, a RAID level 4 implementation may be disposed over the storage bricks 180 of the CASS 100 with one of the bricks designated a parity brick. Essentially, each storage brick 180 may be treated as a disk within the RAID group, with the disks on the parity brick functioning as parity disks in a conventional RAID 4 configuration. It will be apparent to those skilled in the art that other RAID implementations may be disposed over the storage bricks, including a double parity RAID 6 implementation configured to detect and correct double failures. In such an illustrative RAID 6 implementation, two storage bricks 180 are designated and configured as parity bricks. If one or two storage bricks are lost because of, e.g., a failure, then the RAID implementation allows reconstruction of the failed brick(s) in a manner that is similar to reconstruction of failed disk(s). Although data can be retrieved (read) from the disks of the failed storage brick, the brick must be repaired to enable processing of write operations.

Figure 2:
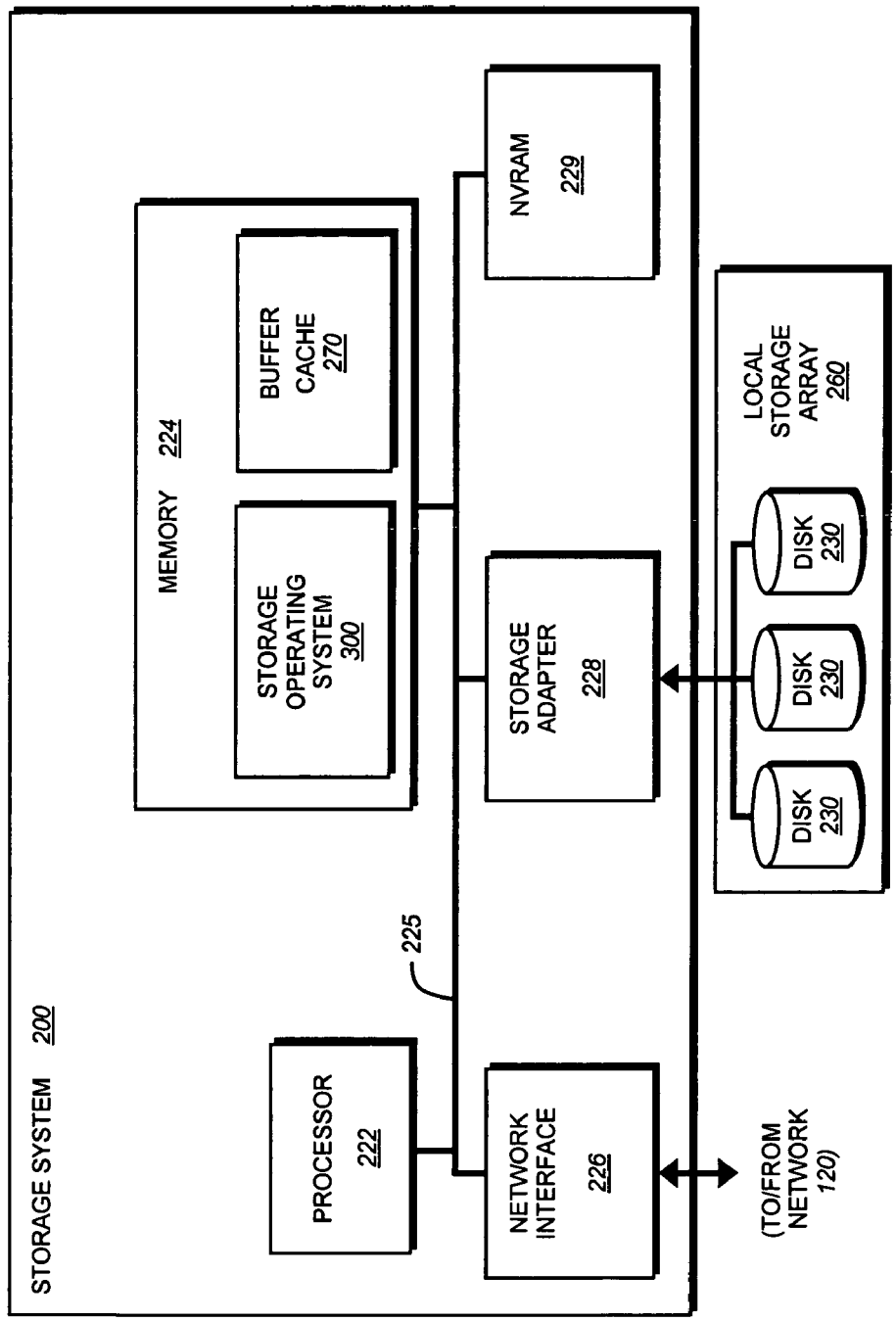
FIG. 2 is a schematic block diagram a storage system of the CASS that may be advantageously used with the present invention.

FIG. 2 is a schematic block diagram a storage system 200 that may be advantageously used with the present invention. The storage system 200 is a computer that provides storage service relating to the organization of information on storage devices, such as disks 230 of a local storage (disk) array 260. The storage system 200 comprises a processor 222, a memory 224, one or more network adapters 226, one or more storage adapters 228 and a non-volatile random access memory (NVRAM 229) interconnected by a system bus 225. The NVRAM 229 is illustratively a solid-state memory array having either back-up battery or other built-in last-state-retention capabilities that holds the last state of the memory array in the event of any power loss to the array. Each network adapter 226 comprises the mechanical, electrical and signaling circuitry needed to connect the storage system 200 to a client 110 over the computer network 120. The storage system 200 also includes a storage operating system 300 that preferably implements a high-level module, such as a file system, to logically organize the information as a hierarchical structure of named data containers, such as directories, files and special types of files called virtual disks (vdisks), on the disks.

In the illustrative embodiment, the memory 224 comprises storage locations that are addressable by the processor and adapters for storing software program code. A portion of the memory may be further organized as a "buffer cache" 270 for storing certain data structures associated with the present invention. The processor and adapters may, in turn, comprise processing elements and/or logic circuitry configured to execute the software code and manipulate the data structures. Storage operating system 300, portions of which is typically resident in memory and executed by the processing elements, functionally organizes the system 200 by, inter alia, invoking storage operations executed by the storage system. It will be apparent to those skilled in the art that other processing and memory means, including various computer readable media, may be used for storing and executing program instructions pertaining to the inventive technique described herein.

The storage adapter 228 cooperates with the storage operating system 300 executing on the system 200 to access information requested by a user (or client). The information may be stored on any type of attached array of writable storage device media such as video tape, optical, DVD, magnetic tape, bubble memory, electronic random access memory, micro-electro mechanical and any other similar media adapted to store information, including data and parity information. However, as illustratively described herein, the information is preferably stored on the disks 230, such as HDD and/or DASD, of local storage array 260. The storage adapter includes input/output (I/O) interface circuitry that couples to the disks over an I/O interconnect arrangement, such as a conventional high-performance, FC serial link topology.

Storage of information on array 260 is preferably implemented as one or more storage "volumes" that comprise a collection of physical storage disks 230 cooperating to define an overall logical arrangement of volume block number (vbn) space on the volume(s). Each logical volume is generally, although not necessarily, associated with its own file system. The disks within a logical volume/file system are typically organized as one or more groups, wherein each group may be operated as a RAID group. An illustrative example of a RAID implementation is a RAID-4 level implementation, although it should be understood that other types and levels of RAID implementations may be used in accordance with the inventive principles described herein.

To facilitate access to the disks 230, the storage operating system 300 implements a write-anywhere file system that cooperates with virtualization modules to "virtualize" the storage space provided by disks 230. The file system logically organizes the information as a hierarchical structure of directories and files on the disks. Each "on-disk" file may be implemented as set of disk blocks configured to store information, such as data, whereas the directory may be implemented as a specially formatted file in which names and links to other files and directories are stored. The virtualization modules allow the file system to further logically organize information as a hierarchical structure of additional data containers, such as vdisks, on the disks that are exported as luns.

In the illustrative embodiment, the storage operating system is preferably the NetApp® Data ONTAP™ operating system available from Network Appliance, Inc., Sunnyvale, Calif. that implements a Write Anywhere File Layout (WAFL®) file system. However, it is expressly contemplated that any appropriate storage operating system may be enhanced for use in accordance with the inventive principles described herein. As such, where the term "WAFL" is employed, it should be taken broadly to refer to any to storage operating system that is otherwise adaptable to the teachings of this invention.

Figure 3:
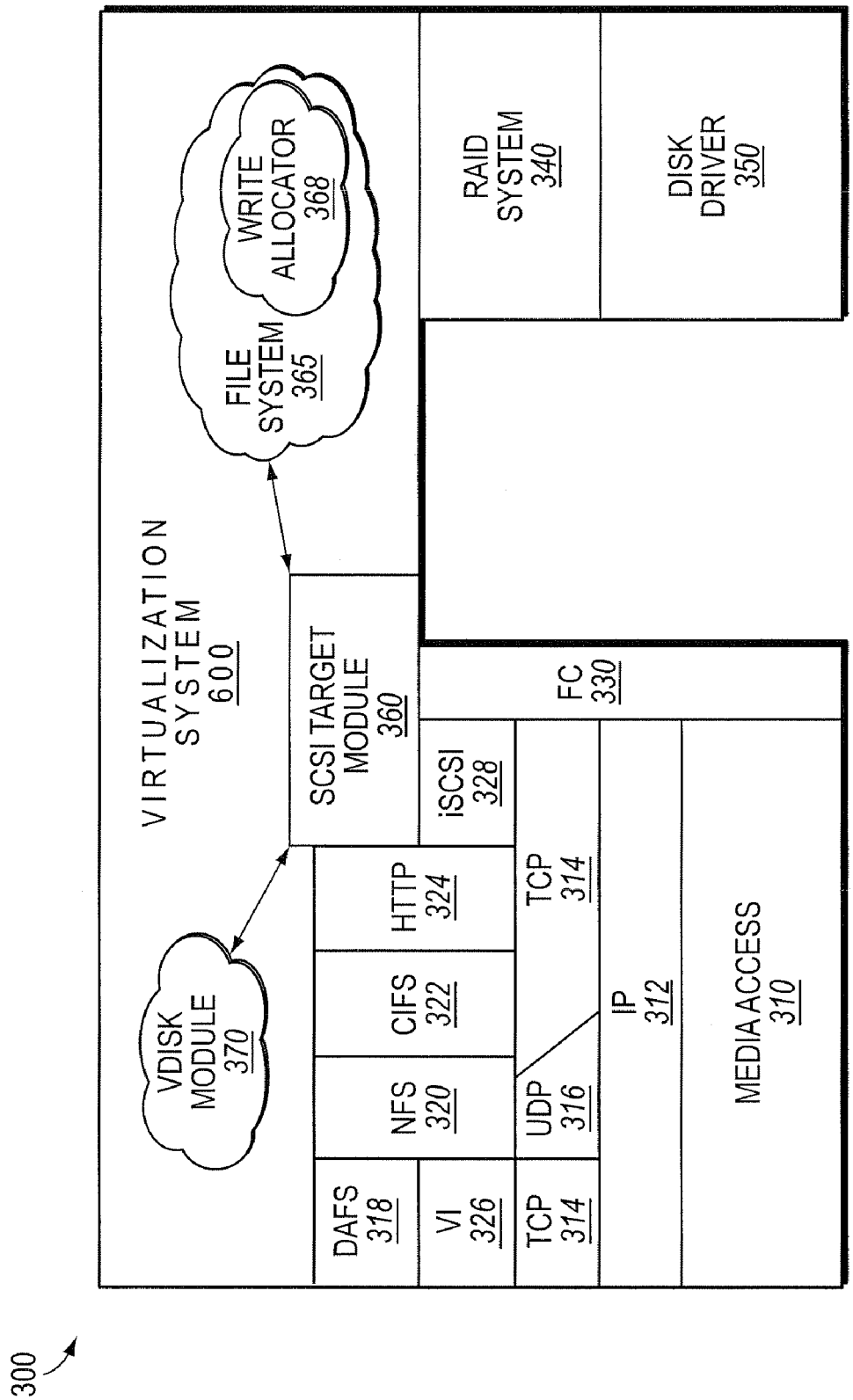
FIG. 3 is a schematic block diagram of a storage operating system that may be advantageously used with the present invention.

FIG. 3 is a schematic block diagram of the storage operating system 300 that may be advantageously used with the present invention. The storage operating system comprises a series of software layers organized to form an integrated network protocol stack or, more generally, a multi-protocol engine that provides data paths for clients to access information stored on the storage system using block and file access protocols. The protocol stack includes a media access layer 310 of network drivers (e.g., gigabit Ethernet drivers) that interfaces to network protocol layers, such as the IP layer 312 and its supporting transport mechanisms, the TCP layer 314 and the User Datagram Protocol (UDP) layer 316. A file system protocol layer provides multi-protocol file access and, to that end, includes support for the Direct Access File System (DAFS) protocol 318, the NFS protocol 320, the CIFS protocol 322 and the Hypertext Transfer Protocol (HTTP) protocol 324. A VI layer 326 implements the VI architecture to provide direct access transport (DAT) capabilities, such as RDMA, as required by the DAFS protocol 318.

An iSCSI driver layer 328 provides block protocol access over the TCP/IP network protocol layers, while a FC driver layer 330 receives and transmits block access requests and responses to and from the storage system. The FC and iSCSI drivers provide FC-specific and iSCSI-specific access control to the blocks and, thus, manage exports of luns to either iSCSI or FCP or, alternatively, to both iSCSI and FCP when accessing the blocks on the storage system. In addition, the storage operating system includes a disk storage module embodied as a RAID system 340 that manages the storage and retrieval of information to and from the volumes/disks in accordance with I/O operations, and a disk driver system 350 that implements a disk access protocol such as, e.g., the SCSI protocol.

Bridging the disk software layers with the integrated network protocol stack layers is a virtualization system 355 that is implemented by a file system 365 interacting with virtualization modules illustratively embodied as, e.g., vdisk module 370 and SCSI target module 360. The vdisk module 370 may be illustratively layered on the file system 365 to enable access by administrative interfaces, such as a user interface (not shown), in response to a user (system administrator) issuing commands to the storage system. The SCSI target module 360 is disposed between the FC and iSCSI drivers 328, 330 and the file system 365 to provide a translation layer of the virtualization system 355 between the block (lun) space and the file system space, where luns are represented as blocks. Further, file system 365 includes a write allocator 368. Write allocator 368 of the file system searches block allocation data structures to identify available storage space for the write data (Step 808) and, to that end, constructs a block layout message that identifies data blocks to be used for storing the write data associated with the write request (Step 810).

The file system is illustratively a message-based system that provides logical volume management capabilities for use in access to the information stored on the storage devices, such as disks. That is, in addition to providing file system semantics, the file system 365 provides functions normally associated with a volume manager. These functions include (i) aggregation of the disks, (ii) aggregation of storage bandwidth of the disks, and (iii) reliability guarantees, such as mirroring and/or parity (RAID). The file system 365 illustratively implements the WAFL file system (hereinafter generally the "write-anywhere file system") having an on-disk format representation that is block-based using, e.g., 4 kilobyte (kB) blocks and using index nodes ("inodes") to identify files and file attributes (such as creation time, access permissions, size and block location). The file system uses files to store metadata describing the layout of its file system; these metadata files include, among others, an inode file. A file handle, i.e., an identifier that includes an inode number, is used to retrieve an inode from disk.

Broadly stated, all inodes of the write-anywhere file system are organized into the inode file. A file system (FS) info block specifies the layout of information in the file system and includes an inode of a file that includes all other inodes of the file system. Each logical volume (file system) has an FS info block that is preferably stored at a fixed location within, e.g., a RAID group. The inode of the root FS info block may directly reference (point to) blocks of the inode file or may reference indirect blocks of the inode file that, in turn, reference direct blocks of the inode file. Within each direct block of the inode file are embedded inodes, each of which may reference indirect blocks that, in turn, reference data blocks of a file.

Operationally, a request from the client 110 is forwarded as a packet over the computer network 120 and onto the storage system 200 where it is received at the network adapter 226. A network driver (of layer 310 or layer 330) processes the packet and, if appropriate, passes it on to a network protocol and file access layer for additional processing prior to forwarding to the write-anywhere file system 365. Here, the file system generates operations to load (retrieve) the requested data from disk if it is not resident "in core", i.e., in the buffer cache 270. If the information is not in the cache, the file system 365 indexes into the inode file using the inode number to access an appropriate entry and retrieve a logical vbn. The file system then passes a message structure including the logical vbn to the RAID system 340; the logical vbn is mapped to a disk identifier and physical block number (disk, pbn) and sent to an appropriate driver (e.g., SCSI) of the disk driver system 350. The disk driver accesses the pbn from the specified disk and loads the requested data block(s) in the cache 270 for processing by the storage system. Upon completion of the request, the storage system (and operating system) returns a reply to the client 110 over the network 120.

It should be noted that the software "path" through the storage operating system layers described above needed to perform data storage access for the client request received at the storage system may alternatively be implemented in hardware. That is, in an alternate embodiment of the invention, a storage access request data path may be implemented as logic circuitry embodied within a field programmable gate array (FPGA) or an application specific integrated circuit (ASIC). This type of hardware implementation increases the performance of the storage service provided by storage system 200 in response to a request issued by client 110. Moreover, in another alternate embodiment of the invention, the processing elements of adapters 226, 228 may be configured to offload some or all of the packet processing and storage access operations, respectively, from processor 222, to thereby increase the performance of the storage service provided by the system. It is expressly contemplated that the various processes, architectures and procedures described herein can be implemented in hardware, firmware or software.

As used herein, the term "storage operating system" generally refers to the computer-executable code operable to perform a storage function in a storage system, e.g., that manages data access and may, in the case of a file server, implement file system semantics. In this sense, the ONTAP software is an example of such a storage operating system implemented as a microkernel and including the WAFL layer to implement the WAFL file system semantics and manage data access. The storage operating system can also be implemented as an application program operating over a general-purpose operating system, such as UNIX® or Windows NT®, or as a general-purpose operating system with configurable functionality, which is configured for storage applications as described herein.

In addition, it will be understood to those skilled in the art that the inventive technique described herein may apply to any type of special-purpose (e.g., file server, filer or multi-protocol storage appliance) or general-purpose computer, including a standalone computer or portion thereof, embodied as or including a storage system 200. An example of a multi-protocol storage appliance that may be advantageously used with the present invention is described in U.S. Patent Publication No. 20040030668 titled, Multi-Protocol Storage Appliance that provides Integrated Support for File and Block Access Protocols, filed on Aug. 8, 2002. Moreover, the teachings of this invention can be adapted to a variety of storage system architectures including, but not limited to, a network-attached storage environment, a storage area network and disk assembly directly-attached to a client or host computer. The term "storage system" should therefore be taken broadly to include such arrangements in addition to any subsystems configured to perform a storage function and associated with other equipment or systems.

Figure 4:
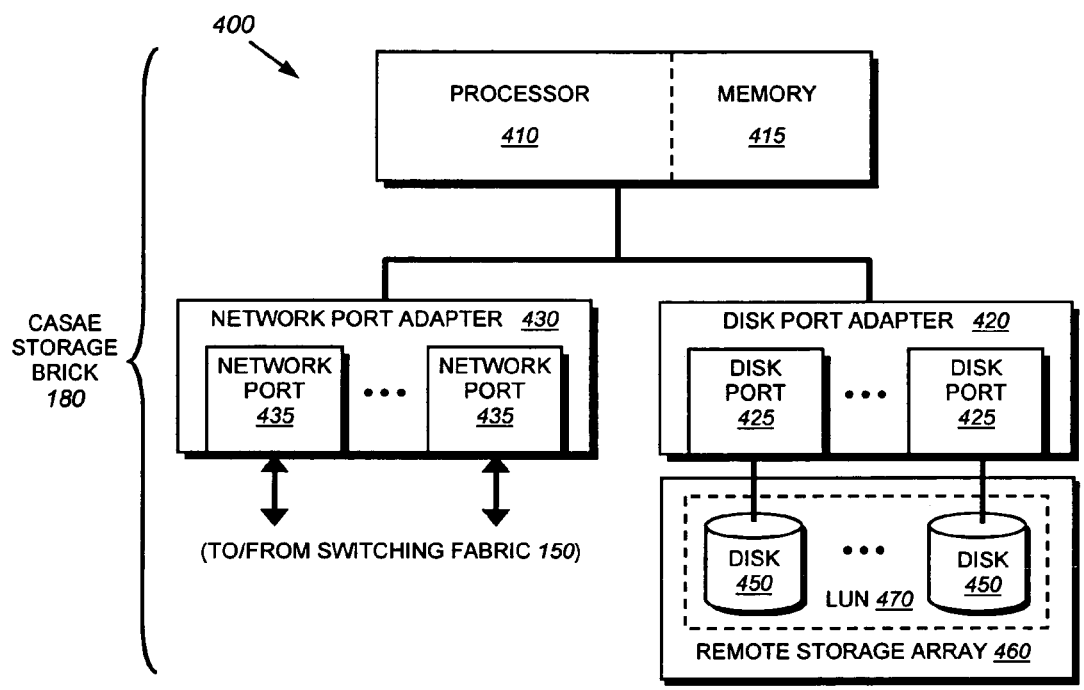
FIG. 4 is a schematic block diagram of a content addressable storage array element (CASAE) of the CASS according to the present invention.

FIG. 4 is a schematic block diagram of a CASAE 400 according to the present invention. The CASAE is illustratively embodied as a block-oriented, ASIC element comprising, inter alia, a controller (e.g., processor 410 and memory 415) coupled to a disk port adapter 420 having a plurality of (e.g., 8) disk ports 425 and a network port adapter 430 having a plurality of (e.g., 2) network ports 435, such as gigabyte Ethernet ports. The processor 410 is adapted to perform the content addressable storage computation according to the present invention. The network ports 435 are adapted to couple the CASAE 400 to the storage system 200 via the switching fabric 150. The disk ports 425, in turn, are adapted to couple the storage resources (e.g., disks 450) to the CASAE to thereby form a CASAE "storage brick" 180.

The disks 450 of the CASAE storage brick 180 are exported as lun 470, portions of which are illustratively allocated to firmware, accounting (including a mapping table described herein) and user data (data blocks). In addition, the disks of the lun 470 are organized as a single RAID level implementation (e.g., a RAID 6) group configured to increase the reliability of the disks 450. If one or two of the disks fail, the storage brick 180 continues to operate because of the RAID 6 implementation feature and the failed disk(s) may be replaced or repaired at the next scheduled downtime. Failure of the processor 410, however, results in an emergency situation because that component is not protected by the RAID implementation. Although data could still be read from the disks, the storage brick cannot process write operations until the failed component is replaced.

Figure 5:
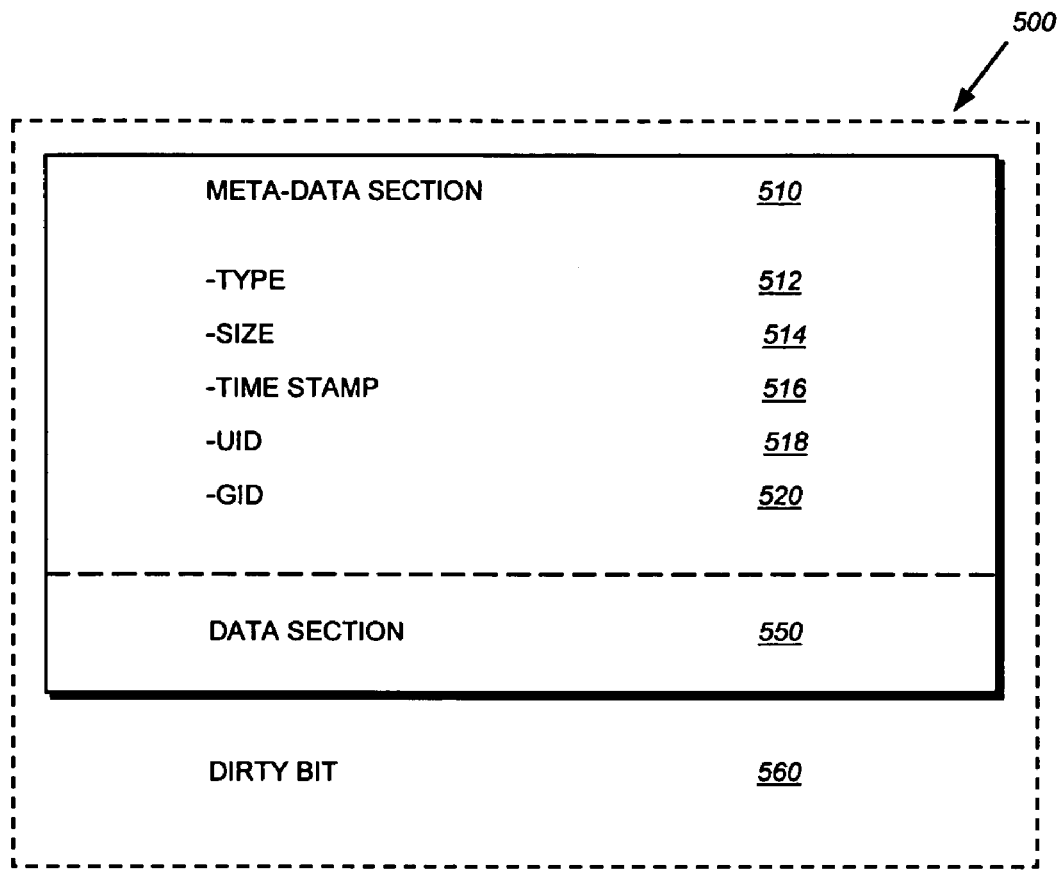
FIG. 5 is a schematic block diagram of an inode that may be advantageously used with the present invention.

In the illustrative embodiment, a file is represented in the write-anywhere file system as an inode data structure adapted for storage on the disks. FIG. 5 is a schematic block diagram of an inode 500, which preferably includes a metadata section 510 and a data section 550. The information stored in the metadata section 510 of each inode 500 describes the file and, as such, includes the type (e.g., regular, directory, vdisk) 512 of file, the size 514 of the file, time stamps (e.g., access and/or modification) 516 for the file and ownership, i.e., user identifier (UID 518) and group ID (GID 520), of the file. The contents of the data section 550 of each inode, however, may be interpreted differently depending upon the type of file (inode) defined within the type field 512. For example, the data section 550 of a directory inode contains metadata controlled by the file system, whereas the data section of a regular inode contains user (file system) data. In this latter case, the data section 550 includes a representation of the data associated with the file.

Specifically, the data section 550 of a regular on-disk inode may include file system data or pointers, the latter referencing 4 kB data blocks on disk used to store the file system data. Given the restricted size (e.g., 128 bytes) of the inode, file system data having a size that is less than or equal to 64 bytes is represented, in its entirety, within the data section of that inode. However, if the file system data is greater than 64 bytes but less than or equal to 64 kB, then the data section of the inode (e.g., a first level inode) comprises up to 16 block pointers, each of which references a 4 kB block of data on the disk.

Moreover, if the size of the data is greater than 64 kB but less than or equal to 64 megabytes (MB), then each pointer in the data section 550 of the inode (e.g., a second level inode) references an indirect block (e.g., a first level block) that contains 1024 pointers, each of which references a 4 kB data block on disk. For file system data having a size greater than 64 MB, each pointer in the data section 550 of the inode (e.g., a third level inode) references a double-indirect block (e.g., a second level block) that contains 1024 pointers, each referencing an indirect (e.g., a first level) block. The indirect block, in turn, that contains 1024 pointers, each of which references a 4 kB data block on disk. When accessing a file, each block of the file may be loaded from disk into the buffer cache 270.

When an on-disk inode (or block) is loaded from disk into buffer cache 270, its corresponding in core structure embeds the on-disk structure. For example, the dotted line surrounding the inode 500 indicates the in core representation of the on-disk inode structure. The in core structure is a block of memory that stores the on-disk structure plus additional information needed to manage data in the memory (but not on disk). The additional information may include, e.g., a "dirty" bit 560. After data in the inode (or block) is updated/modified as instructed by, e.g., a write operation, the modified data is marked "dirty" using the dirty bit 560 so that the inode (block) can be subsequently "flushed" (stored) to disk. The in core and on-disk format structures of the WAFL file system, including the inodes and inode file, are disclosed and described in U.S. Pat. No. 5,819,292 titled Method for Maintaining Consistent States of a File System and for Creating User-Accessible Read-Only Copies of a File System by David Hitz et al., issued on Oct. 6, 1998, incorporated herein by reference.

Figure 6:
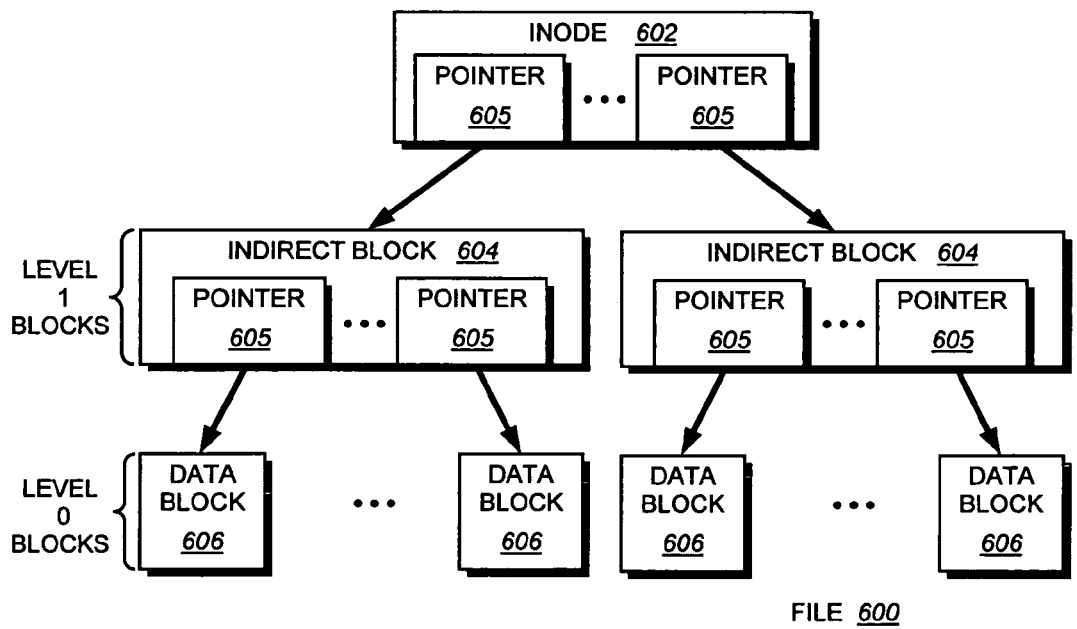
FIG. 6 is a schematic block diagram of a buffer tree of a file that may be advantageously used with the present invention.

FIG. 6 is a schematic block diagram of a buffer tree of a file that may be advantageously used with the present invention. The buffer tree is an internal representation of blocks for a file (e.g., file 600) loaded into the buffer cache 270 and maintained by the write-anywhere file system 365. A root (top-level) inode 602, such as an embedded inode, references indirect (e.g., level 1) blocks 604. Note that there may be additional levels of indirect blocks (e.g., level 2, level 3) depending upon the size of the file. The indirect blocks (and inode) contain pointers 605 that ultimately reference data blocks 606 used to store the actual data of the file. That is, the data of file 600 are contained in data blocks and the locations of these blocks are stored in the indirect blocks of the file. Each level 1 indirect block 604 may contain block pointers to as many as 1024 data blocks. According to the "write anywhere" nature of the file system, these data blocks may be located anywhere on the disks (e.g., disks 450).

Figure 7:
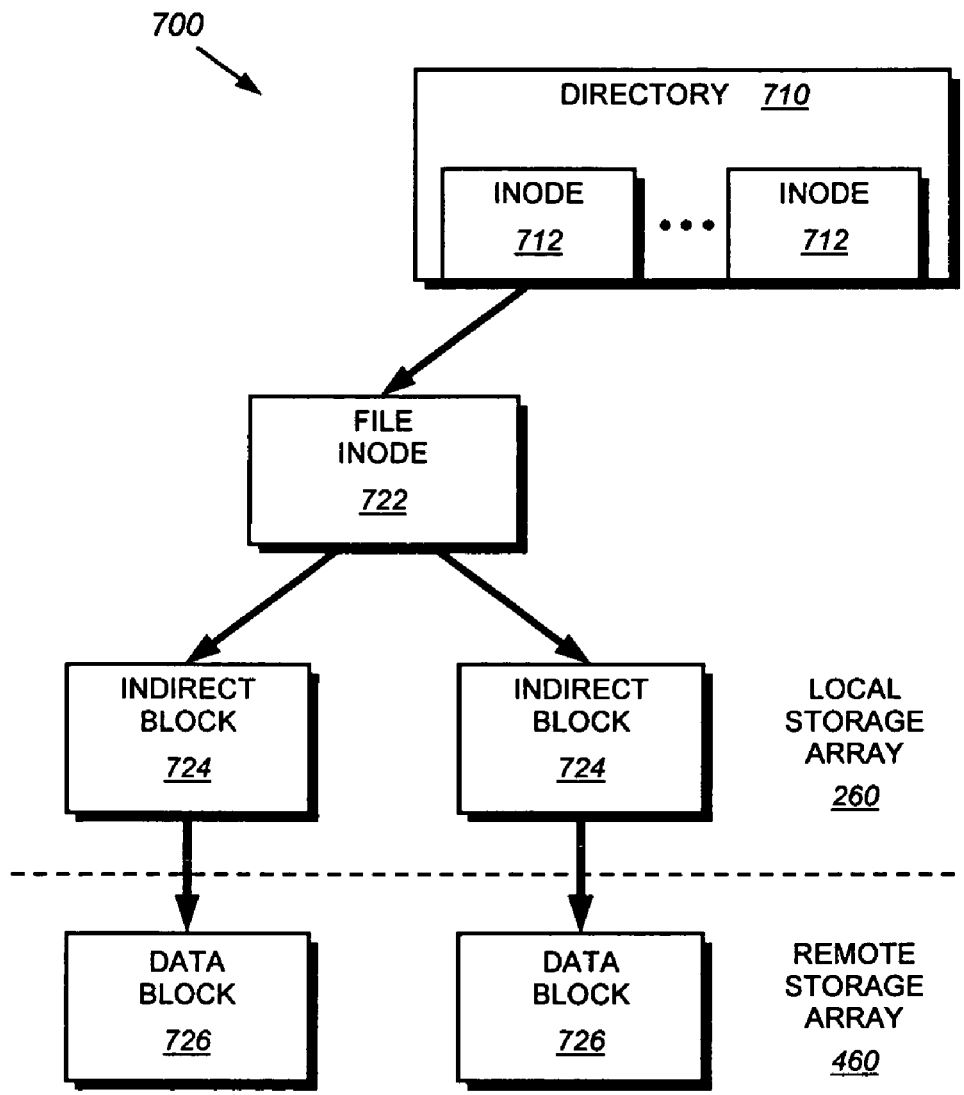
FIG. 7 is a schematic block diagram illustrating a meta-directory and data block on-disk storage layout according to the present invention.

As noted, the disks 230 of local storage array 260 are configured to store a high level meta-directory that describes data containers, e.g., directories, files and luns, served by the CASS 100, whereas the disks 450 of remote storage array 460 are configured to store the actual data blocks of those containers. FIG. 7 is a schematic block diagram illustrating a meta-directory and data block on-disk storage layout 700 according to the present invention. Specifically, the local storage array 260 contains directory blocks 710 with one or more inodes 712 having pointers that reference (point to) file inodes 722. The file inodes, in turn, have pointers that illustratively point to indirect blocks 724 which, in turn, have block pointers that reference actual data blocks 726 stored on the remote storage array 460. Accordingly, all metadata, i.e., inodes and indirect blocks, of the buffer trees for files (and vdisks) reside on the disks 230 of local storage array 260 of storage system 200, while all data blocks reside on the disks 450 of the remote storage arrays 460 of the CASAE storage bricks 180. In other words, the disks (and volumes) on the local storage array 260 store all inodes and indirect blocks of the data containers; the local storage array has no resident data blocks. All block pointers in those inodes or indirect blocks reference data blocks stored on one or more of the remote storage arrays 460.

Communication between the storage system 200 and each CASAE storage brick 180 is illustratively implemented using a storage protocol exchange involving SCSI command descriptor block (CDB) messages. In response to a write request issued by a client and directed to a data container (e.g., a file) stored on the lun 470 of a brick, the file system 365 cooperates with the RAID system 340 to generate a message that includes an operation (e.g., read or write), a block number, status and data (e.g., write data). The message is then passed to the disk driver system 350 and forwarded as a SCSI CDB message to the CASAE 400 of the storage brick 180, which invokes a storage computation process to locate any duplicate data blocks on its lun 470. In response, the CASAE returns to the storage system (file system) a SCSI CDB message including the actual pbn of the location of the write data in the lun 470.

According to the invention, the file system 365 employs a special block number, e.g., block zero, to instruct the CASAE 400 to perform the content addressable storage computation on each data block to determine whether that data has already been written to a location on the lun. The storage computation illustratively involves a hashing function, e.g., MD5, because of the substantial domain space involved with data storage on the disks. The embodiment described herein illustratively employs the MD5 hashing algorithm to compute a hash key, although it will be apparent to those skilled in the art that other hashing algorithms, such as parity or cyclic redundancy checking (CRC), may also be used with the present invention. Depending on the particular hashing algorithm used, computation of the resulting hash key may be time consuming. Execution of some hashing algorithms (such as parity or CRC) may not be as time consuming as others (such as MD5), but the use of the latter algorithms reduces the chances of collisions, unless the domain is extremely large.

Specifically, the CASAE computes a hash key, e.g., a 128 bit address, based on the content of the data block and then determines whether the key has been generated for a previously stored data block. In theory, every unique data block computes to a new 128-bit hash key; yet some blocks will be the same and, accordingly, there will be collisions. If the key has been previously generated, a comparison of the data block contents having similar keys is performed and, if the contents match, a reference count on the previously stored data block is incremented. The block number (location) of the previously stored data block is then returned to the file system. On the other hand, if the hash key has not been previously generated or if the data contents do not match, the data is written to a next available block location on the lun and its location returned to the file system.

Figure 8:
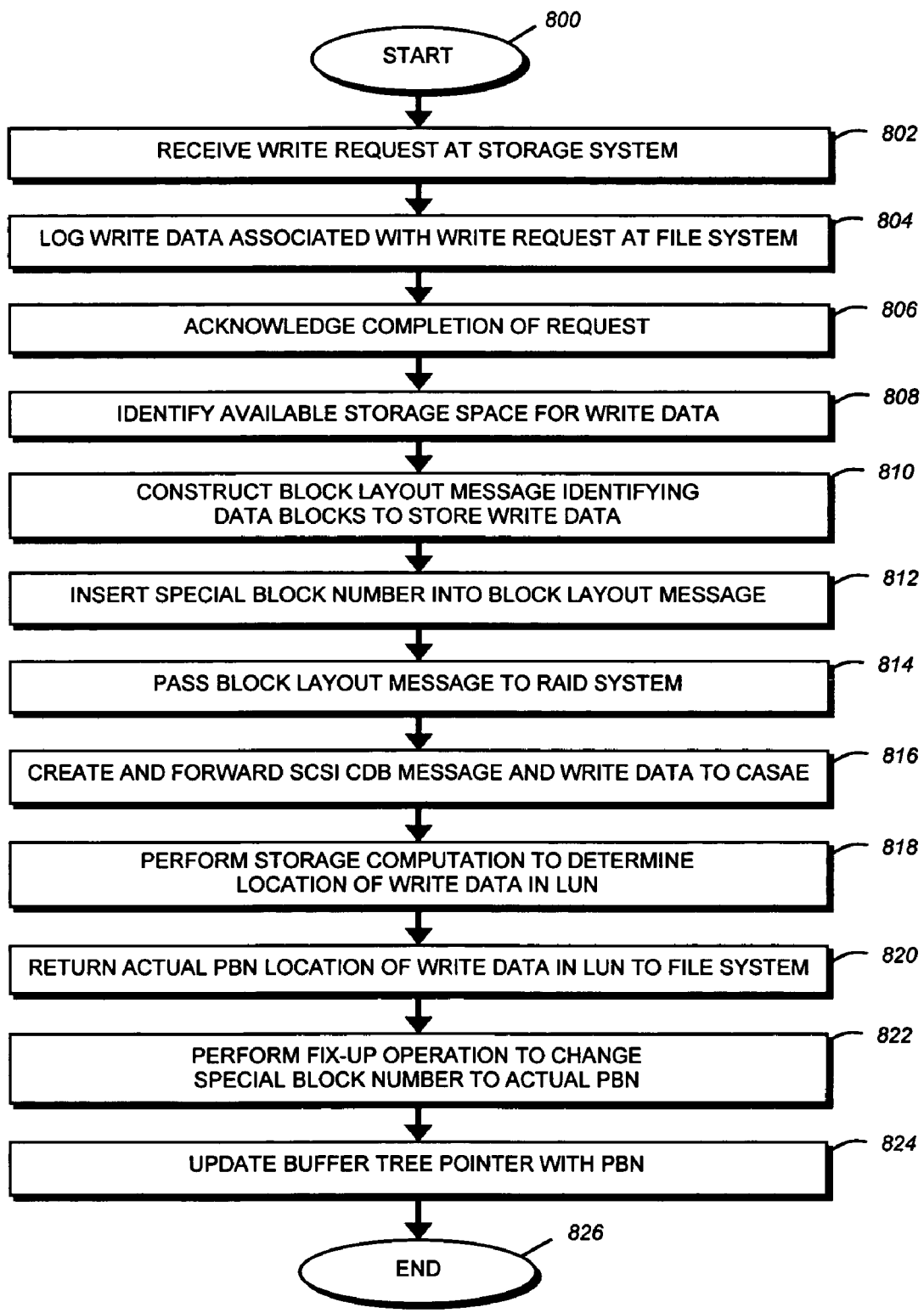
FIG. 8 is a flow chart of a procedure illustrating operation of the storage system in the CASS.

FIG. 8 is a flow chart of a procedure illustrating operation of the storage system 200 in the CASS 100. The procedure starts at Step 800 and proceeds to Step 802 where a file or block-based write request is issued by a client 110 and received at the network protocol stack of the storage system 200. The write request is passed to the file system 365 which, at Step 804, logs write data associated with the request, e.g., in NVRAM 229. In Step 806, the storage system acknowledges completion of the request to the client. Thereafter, during write allocation, a write allocator 368 of the file system searches block allocation data structures to identify available storage space for the write data (Step 808) and, to that end, constructs a block layout message that identifies data blocks to be used for storing the write data associated with the write request (Step 810). According to an aspect of the invention, however, the file system 365 inserts a special block number, e.g., zero, into the message at Step 812 and, in Step 814, passes that message to the RAID system 340.

Note that the RAID system does not have knowledge of the geometry of the remote storage arrays 460 on the bricks 180, i.e., the bricks do not export their storage layout to the RAID system. Accordingly, the RAID system 340 attempts to balance the write allocation (write data) load evenly across all the bricks 180. Illustratively, each brick 180 provides 1 terabyte (TB) of storage and the RAID system attempts to stripe write data across the bricks of the CASS 100 in a balanced manner. To that end, the RAID system cooperates with the disk driver system 350 to create and forward a SCSI CDB message, including a write operation and write data, to an appropriate CASAE (Step 816). Upon receiving the write data, the CASAE 400 performs the content addressable storage computation described herein to determine the location at which to store the write data in the lun 470 (Step 818), i.e., whether there is a duplicate data block containing that data, and, in Step 820, returns a pbn indicating where that block resides in the lun.

Upon receiving the pbn, the file system 365 performs a "fix-up" operation in Step 822 to correct an initial write allocation assumption. That is, the file system initially allocated the write data to the special block number zero but, during the fix-up operation, changes that special block number to the actual pbn location on the brick. In Step 824, the file system updates the buffer tree (e.g., inode and/or indirect block) pointers for the lun 470 (in local storage array 260) to reference the pbn location of that data block. The procedure then ends at Step 826.

Figure 9:
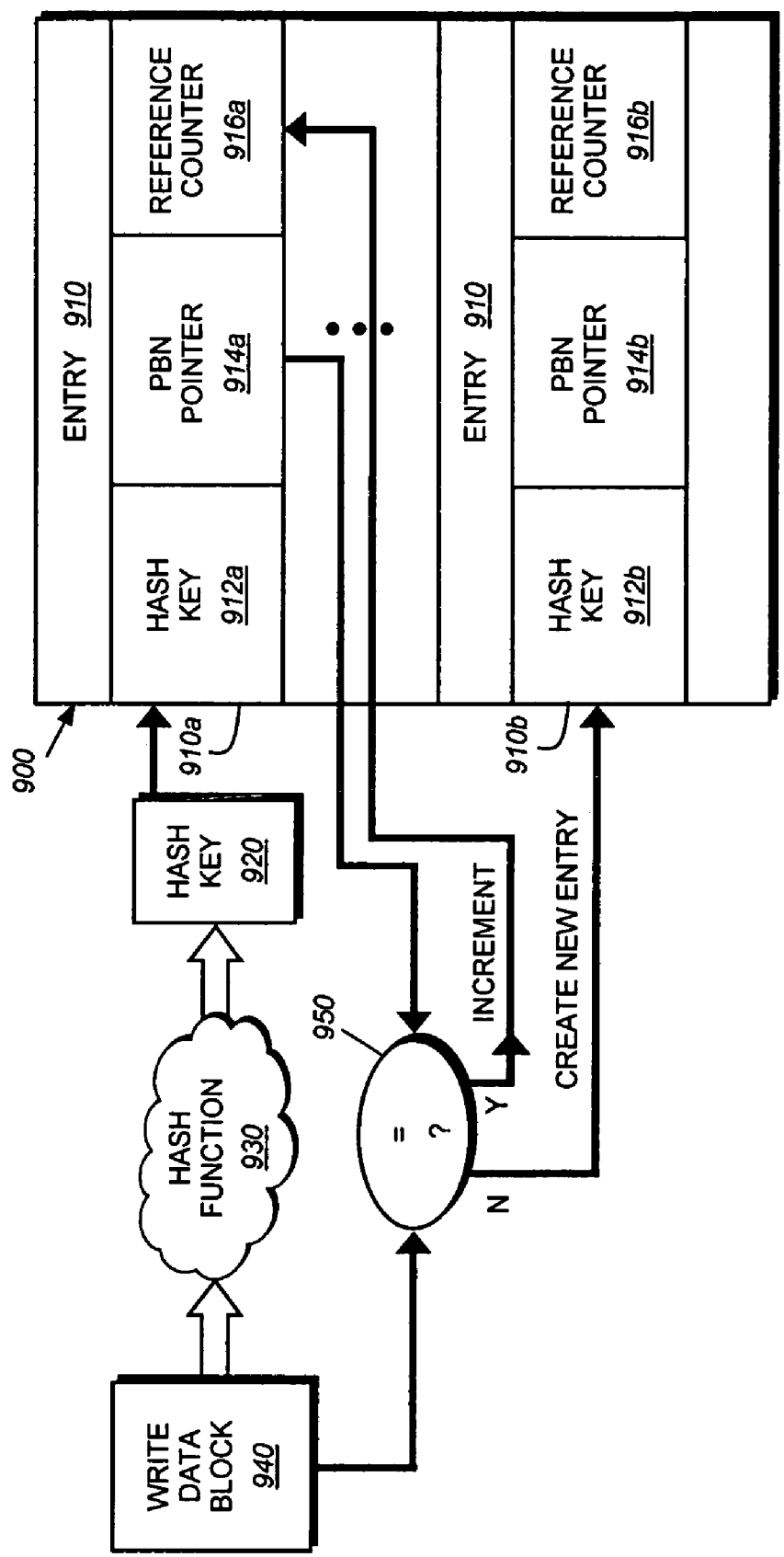
FIG. 9 is a functional block diagram illustrating a content addressable storage computation performed by the CASAE in accordance with the present invention.

FIG. 9 is a functional block diagram illustrating the content addressable storage computation performed by the CASAE in accordance with the present invention. Illustratively, the processor 410 of CASAE computes a hash key 920 from the content of a write data block 940 using a hash function 930. The resulting hash key 920 is then "looked-up" in a content addressable mapping data structure to determine if there is a duplicate data block stored on the remote storage array 460 of the CASAE storage brick 180. The mapping data structure may be organized in a variety of forms, including as a binary tree (B-tree); however, for ease of description and understanding, the mapping data structure is depicted in tabular form, e.g., as a mapping table 900 having a plurality of entries 910 indexed by hash key.

Each entry 910 of the mapping table 900 illustratively contains a hash key field 912, a pbn pointer field 914 configured to reference a previously stored data block (i.e., the field does not hold the actual content of the data block) on the disks 450 of the remote storage array 460 and a reference count field 916. Note that there may be multiple entries 910 with hash keys 912 that match the resulting hash key 920, although the contents of the reference data blocks may not be the same. Assume a match results between hash key 920 and hash key 912a of entry 910a. Comparator 950 compares the content of the write data block 940 with the content of a write data block retrieved from disk 450 (as referenced by the pbn pointer 914a in entry 910a). If the contents of the blocks match, then the data is a duplicate and the reference count 916a in entry 910a is incremented. As noted, the CASAE 400 then returns a copy of the pbn pointer 914a to the file system 365 as if it had actually stored the write data block 940 at that location.

The incremented reference count 916 is also reflected in the appropriate inode 722 or indirect block 724 stored on the local storage array 260. Using the copy of the pbn pointer 914a, the file system 365 cooperates with the RAID system 340 to perform the fix-up operation to update the reference count for the appropriate inode or indirect block in the buffer tree for the lun 470. Essentially, one or more buffer tree (e.g., inode and/or indirect block) pointers for the lun 470 are updated in local storage array 260 to reference the pbn location of that data block.

However, if there is not a match between hash key 920 and hash key 912 of an entry 910 or if the keys do match but the contents of the data blocks do not match, then the data is not a duplicate and the write data block 940 is written to a next available pbn block location on the lun 470 and its location is returned to the file system. Note that if the contents of the data blocks do not match, then other entries 910 of the table 900 are not traversed. Here, a trade off is made between absolute data compression and performance. Even though there may be other duplicate data blocks, the chances of such duplicates existing (particularly when using the MD5 hashing function) is fairly low; accordingly, indexing into the content addressable mapping table 900 stops at the first hash key "hit". The write data block 940 is then stored at the new pbn location and a new entry 910b is created in the table 900. Specifically, the hash key field 912b of the new entry is populated with the resulting hash key 920 and the pbn pointer field 914b is populated with the pbn pointer of the next available location. In addition, the reference count field 916b is set to reference only the single write data block 940 (e.g., set to a reference count of one).

Figure 10:
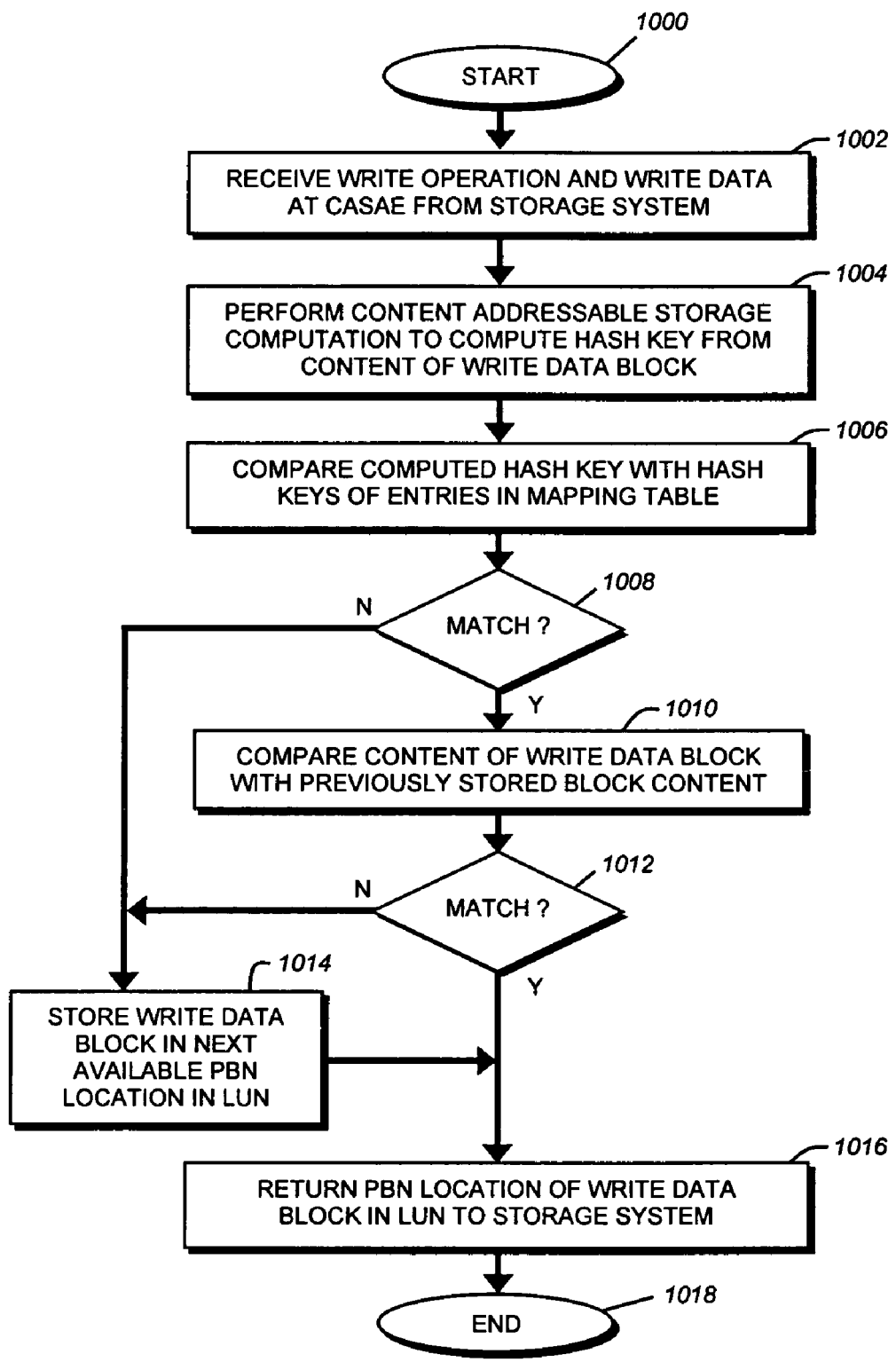
FIG. 10 is a flow chart of a procedure illustrating operation of the CASAE in the CASS.

FIG. 10 is a flow chart of a procedure illustrating operation of the CASAE 400 in the CASS 100. The procedure starts in Step 1000 and proceeds to Step 1002 where the CASAE receives the SCSI CDB message, including the write operation and write data, from the storage system. In Step 1004, the CASAE processor performs the content addressable storage computation to compute a hash key from the content of a write data block. Note that the hash key is computed on a 4 k byte basis, i.e., on the write data content of each data block.

The resulting hash key is then "looked-up" in the mapping table to determine if there is a duplicate block on the remote storage array of the CASAE.

Specifically, the computed hash key is compared with the hash keys of the entries in the table to determine if there is a match (Step 1006). If there is a match (Step 1008), the content of the data block is compared with the previously stored block content in Step 1010. If the data content comparison results in a match (Step 1012), the write data is a duplicate and the CASAE returns (to the storage system) the pbn location of the write data block where the data is stored in lun (which, in this case, is the previous location of the matching write data block) in Step 1016. Otherwise, the write data is not a duplicate and, accordingly, the write data block is stored in a next available pbn block location on the lun in Step 1014 and the pbn location of the block where the data is stored in lun is returned to the storage system in Step 1016. The procedure then ends at Step 1018.

In the illustrative embodiment described herein, each storage brick 180 can data compress (de-duplicate) its own storage space, but cannot de-duplicate another brick's space. That is, if a data block is written to a first brick that is the same block that was previously written to a second brick, there will be two copies of that block. By enabling each brick to manage only its own storage space, the domain of collisions is restricted to the number of 4 k blocks that can be stored on a brick, e.g., one TB of storage. In addition, the storage computation is advantageously distributed among all of the storage bricks. For example, assume it takes a millisecond for each brick to compute the MD5 hash key. With 8 bricks, computations for 32 k bytes of write data are performed in one millisecond, as opposed to 8 milliseconds if the computations were performed sequentially on a single brick.

While there has been shown and described illustrative embodiments of a CASAE of a storage system configured to eliminate duplicate data stored on its storage resources, it is to be understood that various other adaptations and modifications may be made within the spirit and scope of the invention. For example, in an alternate embodiment, the invention may be extended to another layer of pbn-to-actual pbn mapping in the storage brick 180, so the brick can return a unique block number for every block written to it (even though some blocks may internally point to the same block). In this way, the file system assumes that the write data blocks are always newly allocated.

The foregoing description has been directed to specific embodiments of this invention. It will be apparent, however, that other variations and modifications may be made to the described embodiments, with the attainment of some or all of their advantages. For instance, it is expressly contemplated that the teachings of this invention can be implemented as a computer-readable medium having program instructions executing on a computer, hardware, firmware, or a combination thereof. Accordingly this description is to be taken only by way of example and not to otherwise limit the scope of the invention. Therefore, it is the object of the appended claims to cover all such variations and modifications as come within the true spirit and scope of the invention.

What is claimed is:

1. A method for managing storage resources of a storage system, the method comprising:

performing, on a remote storage array at the logical unit level, a content addressable storage computation to compute a key from content of a first data block in response to receiving a client request to write the first data block to the storage system;

comparing, on the remote storage array, the computed key with keys of entries in a mapping table to determine if there is a match;

in response to determining there is a match,
comparing, on the remote storage array, the content of the first data block with content of a second data block previously stored on the resources of the remote storage array; and in response to determining that the comparison of the data block contents results in a match,
incrementing a reference count on the previously stored data block,
cooperating with a file system executing on the storage system to provide the storage system with a physical block number of the second data block to the storage system rather than storing duplicate data block contents on the storage resources of the remote storage array; and
wherein the remote storage array operates in parallel with one or more additional remote storage arrays to allow aggregation of resources among the remote storage arrays, the parallel operation performing content addressable storage computations associated with the write operations on each of the one or more remote storage arrays.

2. The method of claim 1, further comprising:
if one of the keys do not match and the data block contents do not match:
writing the first data block to a next available block location on the storage resources; and
providing a block number of the next available location to the storage system.

3. The method of claim 1, further comprising:
computing the key using a hash function.

4. A computer system configured for managing storage resources of a storage system, comprising:
a remote content addressable storage array element configured to
compute, on a remote storage array at the logical unit level by a processor, a key based on content of a first data block in response to receiving a client request to write the first data block to the storage device,
determine whether the key has been generated for a second data block previously stored on the resources,
if so compare, on the remote storage array, the data block contents of the remote storage array,
if there is a match increment a reference count on the previously stored data block and cooperate with a file system executing on the storage system to provide the storage system with a physical block number of the second data block to the storage system rather than writing the first data block to the storage device; and
wherein the remote storage array operates in parallel with one or more additional remote storage arrays to allow aggregation of resources among the remote storage arrays, the parallel operation performing content addressable storage computations associated with the write operations on each of the one or more remote storage arrays.

5. The system of claim 4, further comprising:
the physical block number is a physical block number of a logical unit stored on the storage resources.

6. The system of claim 4, further comprising:
if one of the key has not been generated for the second data block previously stored on the resources, the content addressable storage array element is further configured to write the first data block to a next available block location on the storage resources and return a block number of the next available location to a storage system coupled to the element.

7. The system of claim 4, further comprising:
the key is computed using a hash function.

8. The system of claim 7, further comprising:
the hash function is a MD5 hashing algorithm.

9. The system of claim 4, further comprising:
a mapping data structure used by the content addressable storage array element to determine whether the key has been generated for the second data block.

10. The system of claim 9, further comprising:
the mapping data structure is a table having a plurality of entries, each entry containing a hash key, a pointer configured to reference a data block previously stored on the storage resources and a reference count.

11. The system of claim 4, further comprising:
the content addressable storage array element is further configured to prevent storage of duplicate data block contents on the storage resources.

12. An apparatus configured to manage storage resources of a storage system, the apparatus comprising:
performing, by a processor, at the logical unit level, a content addressable storage computation to compute a key from content of a first data block in response to receiving a client request to write the first data block to the storage system;
means for comparing the computed key with keys of entries in a mapping table to determine if there is a match;
in response to determining that there is a match, means for comparing the content of the first data block with content of a second data block previously stored on the resources of a remote storage array;
in response to determining the comparison of the data block contents results in a match,
means for incrementing a reference count on the previously stored data block, and
means for cooperating with a file system executing on the storage system to provide the storage system with a physical block number of the second data block to the storage system rather than storing duplicate data block contents on the storage resources of the remote storage array; and
wherein the remote storage array operates in parallel with one or more additional remote storage arrays to allow aggregation of resources among the remote storage arrays, the parallel operation performing content addressable storage computations associated with the write operations on each of the one or more remote storage arrays.

13. The apparatus of claim 12, further comprising:
if one of the keys do not match and the data block contents do not match:
means for writing the first data block to a next available block location on the storage resources; and
means for providing a block number of the next available location to the storage system.

14. The apparatus of claim 12, further comprising:
means for computing the key using a hash function.

15. A computer readable medium containing executable program instructions executed by a processor, comprising:
program instructions that perform, on a remote storage array at the logical unit level, a content addressable storage computation to compute a key from content of a first data block in response to receiving a client request to write the first data block to the storage system;
program instructions that compare, on the remote storage array, the computed key with keys of entries in a mapping table to determine if there is a match;
program instructions that compare, on a remote storage array, the content of the first data block with content of a second data block previously stored on the resources in response to determining that there is a match, comparing;
program instructions that, in response to determining that the comparison of the data block contents results in a match,
increment a reference count on the previously stored data block and
cooperate with a file system executing on the storage system to provide the storage system with a physical block number of the second data block to the storage system rather than storing duplicate data block contents on the storage resources of the remote storage array; and
wherein the remote storage array operates in parallel with one or more additional remote storage arrays to allow aggregation of resources among the remote storage arrays, the parallel operation performing content addressable storage computations associated with the write operations on each of the one or more remote storage arrays.

16. The computer readable medium of claim 15, further comprising:
if one of the keys do not match and the data block contents do not match, one or more program instructions for:
writing the first data block to a next available block location on the storage resources; and
providing a block number of the next available location to the storage system.

17. The computer readable medium of claim 15, further comprising:
computing the key using a hash function.

18. A method for managing storage resources of a storage system, the method comprising:
receiving from a storage system a write request at a content addressable storage array element (CASAE), the CASAE coupled to a plurality of disks of a remote storage array, the remote storage array configured to store user data of a data container served by the storage system;
performing, on the remote storage array at the logical unit level, a content addressable storage computation, the computation resulting in a key computed from content of a first data block;
comparing, on the remote storage array, the computed key with a plurality of previously generated keys to determine if there is a match, the previously generated keys associated with previously stored data blocks;
in response to determining that there is a match, comparing the content of the first data block with content of a second data block previously stored on the remote storage array and
in response to determining that the comparison of the data block contents results in a match,
incrementing a reference count on the previously stored data block, and
cooperating with a file system executing on the storage system to provide the storage system with a physical block number of the second data block to the storage system rather than storing duplicate data block contents on the remote storage array; and wherein the remote storage array operates in parallel with one or more additional remote storage arrays to allow aggregation of resources among the remote storage arrays, the parallel operation performing content addressable storage computations associated with the write operations on each of the one or more remote storage arrays.

19. The method of claim 18, further comprising:
if one of the previously generated keys do not match and the data block contents do not match:
writing the first data block to a next available block location on the remote storage array; and
providing a block number of the next available location to the storage system.

20. The method of claim 18, further comprising:
computing the key using a hash function.

21. A method for managing a storage system, comprising:
receiving a write request to write a first data block to a remote storage array;
computing, on the remote storage array at the logical unit level, a hash key of the first data block;
comparing, on the remote storage array, the hash key of the first data block with previously computed hash keys of stored data blocks, the stored data blocks stored in the remote storage array;
in the event that the hash key of the first data block does not match any of the previously computed hash keys, storing the first data block to the remote storage array;
in the event that the hash key of the first data block does match a previously computed hash key;
comparing, on the remote storage array, the first data block with one or more stored data blocks associated with the previously computed hash key;
in the event that the first data block matches one of the one or more data blocks associated with the previously computed hash key, cooperating with a file system executing on the storage system to provide the storage system with a physical block number of a stored data block associated with the previously computed hash key to the storage system;
updating a pointer to a location of the stored data block;
in the event that the first data block does not match the one or more stored data blocks associated with the previously computed hash key, storing the first data block to the storage array; and
wherein the remote storage array operates in parallel with one or more additional remote storage arrays to allow aggregation of resources among the remote storage arrays, the parallel operation performing content addressable storage computations associated with the write operations on each of the one or more remote storage arrays.

22. A system for managing a storage system, comprising:
a write request to write a first data block to a remote storage array;
a processor on a content addressable storage array element, to compute, at the logical unit level, a hash key of the first data block;
the processor to compare the hash key of the first data block with previously computed hash keys of stored data blocks, the stored data blocks stored in the remote storage array;
in the event that the hash key of the first data block does not match any of the previously computed hash keys, the processor to store the first data block to the remote storage array;
in the event that the hash key of the first data block does match a previously computed hash key;
the processor to compare, on the remote storage array, the first data block with one or more stored data blocks associated with the previously computed hash key;
in the event that the first data block matches one of the one or more data blocks associated with the previously computed hash key, the processor to cooperate with a file system executing on the storage system to provide the storage system with a physical block number of a stored data block associated with the previously computed hash key to the storage system;
the processor to update a pointer to a location of the stored data block;
in the event that the first data block does not match the one or more stored data blocks associated with the previously computed hash key, the processor to store the first data block to the remote storage array; and
wherein the remote storage array operates in parallel with one or more additional remote storage arrays to allow aggregation of resources among the remote storage arrays, the parallel operation performing content addressable storage computations associated with the write operations on each of the one or more remote storage arrays.

23. A computer readable medium containing executable program instructions executed by a processor, comprising:
program instructions that receive a write request to write a first data block to a remote storage array;
program instructions that compute, on the remote storage array at the logical unit level, a hash key of the first data block;
program instructions that compare, on the remote storage array, the hash key of the first data block with previously computed hash keys of stored data blocks, the stored data blocks stored in the storage array;
program instructions that, in the event that the hash key of the first data block does not match any of the previously computed hash keys, store the first data block to the remote storage array;
program instructions that, in the event that the hash key of the first data block does match a previously computed hash key;
compare, on the remote storage array, the first data block with one or more stored data blocks associated with the previously computed hash key;
in the event that the first data block matches one of the one or more data blocks associated with the previously computed hash key, cooperate with a file system executing on the storage system to provide the storage system with a physical block number of a stored data block associated with the previously computed hash key to the storage system;
update a pointer to a location of the stored data block;
in the event that the first data block does not match the one or more stored data blocks associated with the previously computed hash key, store the first data block to the remote storage array; and
wherein the remote storage array operates in parallel with one or more additional remote storage arrays to allow aggregation of resources among the remote storage arrays, the parallel operation performing content addressable storage computations associated with the write operations on each of the one or more remote storage arrays.

* * * * *